(12) United States Patent
Kitagawa et al.

(10) Patent No.: US 11,876,152 B2
(45) Date of Patent: Jan. 16, 2024

(54) ELECTRONIC COMPONENT MOUNTING PACKAGE AND ELECTRONIC MODULE

(71) Applicant: KYOCERA Corporation, Kyoto (JP)

(72) Inventors: Akihiko Kitagawa, Kyoto (JP); Yoshiaki Itakura, Kyoto (JP)

(73) Assignee: Kyocera Corporation

( * ) Notice: Subject to any disclaimer, the term of this patent is extended or adjusted under 35 U.S.C. 154(b) by 594 days.

(21) Appl. No.: 17/256,038

(22) PCT Filed: Jun. 28, 2019

(86) PCT No.: PCT/JP2019/025765
§ 371 (c)(1),
(2) Date: Dec. 24, 2020

(87) PCT Pub. No.: WO2020/004606
PCT Pub. Date: Jan. 2, 2020

(65) Prior Publication Data
US 2021/0151636 A1 May 20, 2021

(30) Foreign Application Priority Data
Jun. 29, 2018 (JP) ................................. 2018-124327

(51) Int. Cl.
| H01L 33/48 | (2010.01) |
| H01L 33/62 | (2010.01) |
| H01L 33/46 | (2010.01) |
| H01L 33/60 | (2010.01) |

(52) U.S. Cl.
CPC ............ *H01L 33/486* (2013.01); *H01L 33/46* (2013.01); *H01L 33/60* (2013.01); *H01L 33/62* (2013.01)

(58) Field of Classification Search
CPC ....... H01L 33/44; H01L 33/46; H01L 33/483; H01L 33/486; H01L 33/60; H01L 33/62
See application file for complete search history.

(56) References Cited

U.S. PATENT DOCUMENTS

| 9,812,531 | B2 * | 11/2017 | Jang ......................... H01L 33/44 |
| 9,935,251 | B1 * | 4/2018 | Johnson ................... H01L 33/62 |
| 2012/0314393 | A1 * | 12/2012 | Leib ......................... H01L 24/97 |
| | | | 29/592.1 |

(Continued)

FOREIGN PATENT DOCUMENTS

| CN | 101071838 A | * 11/2007 | ............. H01L 33/60 |
| EP | 1720386 A2 | * 11/2006 | ............. H05K 3/403 |
| EP | 1953818 A1 | * 8/2008 | ............. H01L 33/60 |

(Continued)

*Primary Examiner* — Matthew E Warren
(74) *Attorney, Agent, or Firm* — Volpe Koenig

(57) ABSTRACT

An electronic component mounting package includes: a substrate with ceramic as a base material, the substrate including a cavity having a bottom surface where an electronic component mounting part is located and an inner periphery that has a corner part and a straight part; and an inner peripheral surface where a first metal film is located, the first metal film having a thickness larger at the straight part than at the corner part on the inner periphery having a single distance from the bottom surface or the first metal film having a surface roughness larger at the straight part than at the corner part on the inner periphery having a single distance from the bottom surface.

15 Claims, 5 Drawing Sheets

(56) References Cited

U.S. PATENT DOCUMENTS

2014/0264390 A1* 9/2014 Liu .................... H01L 21/0254
257/79

FOREIGN PATENT DOCUMENTS

| | | | | |
|---|---|---|---|---|
| JP | 2003-282955 A | 10/2003 | | |
| JP | 2004179439 A | * 6/2004 | ............ | H01L 33/60 |
| JP | 2006-041179 A | 2/2006 | | |
| JP | 2007-234846 A | 9/2007 | | |
| JP | 2018-037583 A | 3/2018 | | |
| WO | WO-2018043096 A1 | * 3/2018 | ............ | H01L 23/02 |

* cited by examiner

ELECTRONIC COMPONENT MOUNTING PACKAGE AND ELECTRONIC MODULE

TECHNICAL FIELD

The present disclosure relates to an electronic component mounting package and an electronic module.

BACKGROUND

There has been known, for a light-emitting element, a ceramic package that uses ceramic as a base material and has a cavity formed therein having a bottom surface where an electronic component mounting part on which a light-emitting element, such as an LED, is to be mounted is configured (JP 2006-41179 A). The inner peripheral surface of the cavity in which the light-emitting element is accommodated is inclined outward from the bottom surface toward an opening, thereby being configured such that light emitted from the light-emitting element and reflected by the lateral surface of the cavity is released outside from the end of the opening, so that light is released with high efficiency. In order to improve reflectivity on the lateral surface of the cavity, a metal film is applied to the lateral surface (JP 2007-234846 A).

SUMMARY

An electronic component mounting package includes: a substrate with ceramic as a base material, the substrate including a cavity having a bottom surface where an electronic component mounting part is located and an inner periphery that has a corner part and a straight part; and an inner peripheral surface where a first metal film is located, the first metal film having a thickness larger at the straight part than at the corner part on the inner periphery having a single distance from the bottom surface.

An electronic component mounting package includes: a substrate with ceramic as a base material, the substrate including a cavity having a bottom surface where an electronic component mounting part is located and an inner periphery that has a corner part and a straight part; and an inner peripheral surface where a first metal film is located, the first metal film having a surface roughness larger at the straight part than at the corner part on the inner periphery having a single distance from the bottom surface.

DETAILED DESCRIPTION

Figure 1:
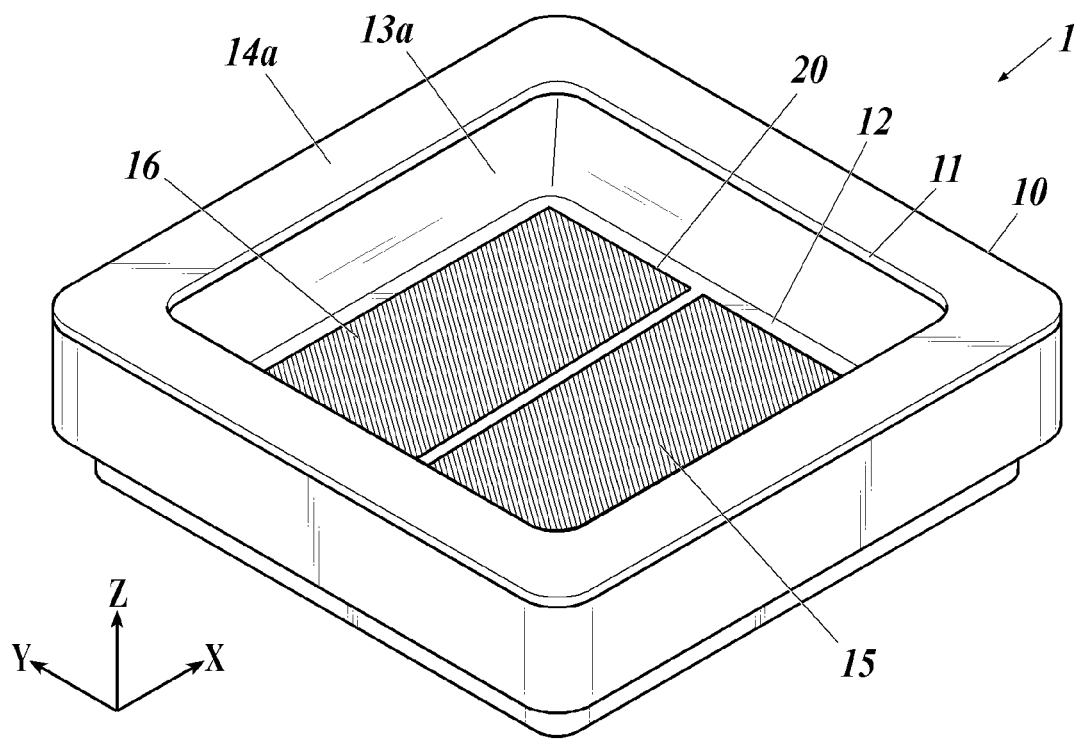
FIG. 1 is a perspective view showing an electronic component mounting package according to an embodiment of the present disclosure.
Figure 2:
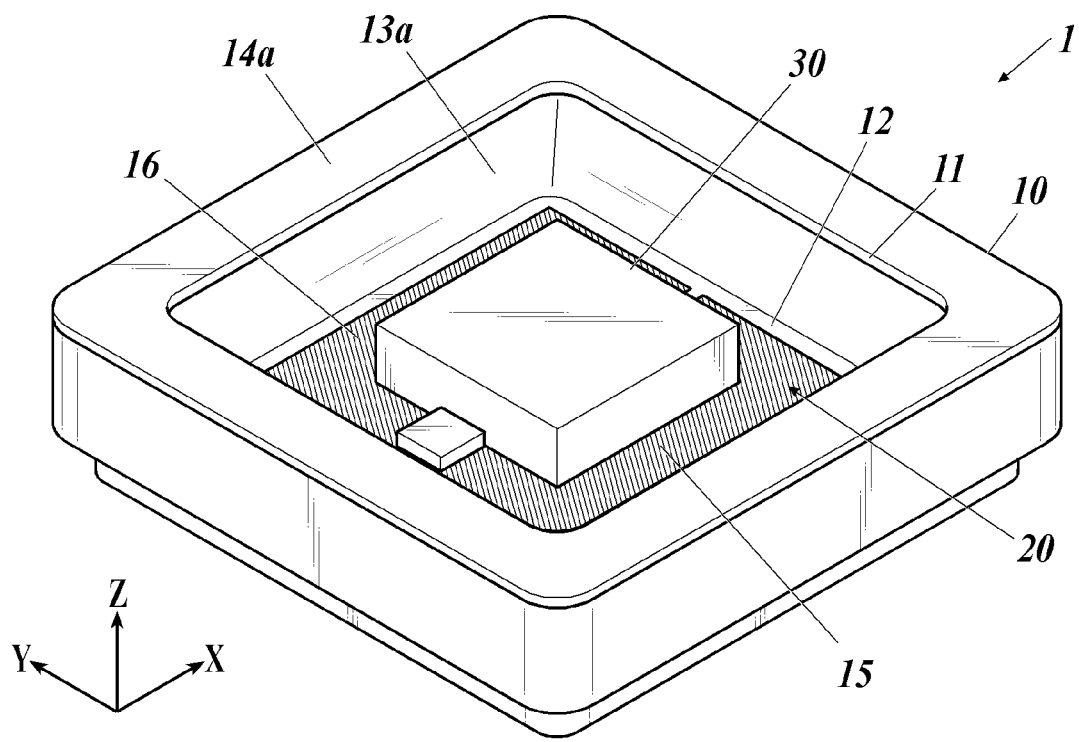
FIG. 2 is a perspective view showing the electronic component mounting package according to the embodiment of the present disclosure with an electronic component mounted.

Hereinafter, an embodiment of the present disclosure will be described with reference to the drawings.

In this embodiment, there is described an example of an optical module having an optical element (light-emitting diode) as an electronic component that is mounted in an electronic component mounting package for mounting an electronic component.

As shown in FIG. 1 to FIGS. 3A to 3C, an optical element mounting package 1 of this embodiment is mainly composed of a substrate 10 using ceramic as a base material. The substrate 10 has quadrilateral main surfaces (bottom surface and upper surface). Directions parallel to their sides are referred to as X and Y, and a direction perpendicular to the XY plane is referred to as Z. This three-axis orthogonal coordinate system is shown in the drawings.

In the substrate 10, a cavity 20 that opens at the upper surface is formed. In a Z-direction view (FIG. 3A), the inner periphery 21 of the cavity 20 has a shape that matches the outer shape of the substrate 10, and has corner parts 21a and straight parts 21b. In the Z-direction view, four sides of the substrate 10 are arranged parallel to four sides of the cavity 20, and each corner has an R (round) having a predetermined curvature.

The inner peripheral surface 13 of the cavity 20 is inclined outward from a bottom surface 12 toward an opening 11 of the cavity. That is, the inner peripheral surface 13 of the cavity 20 is inclined so as to be closest to the central axis Az of the cavity in the Z direction at the bottom surface 12 and farthest therefrom at the opening 11. Hence, the area of the XY section of the cavity 20 is smallest at the bottom surface 12 and largest at the opening 11.

On the inner peripheral surface 13 of the cavity 20, a metal film 13a is located. On the substrate upper-end surface 14 surrounding the cavity 20, a metal film 14a is located. These metal films 13a, 14a are located so as to be continuous, for example. As the metal film 13a, for example, an aluminum film, which is a film of a metal having high thermal conductivity and high reflectivity, is used, and may have at least one metal film selected from a tungsten film, a nickel film and a gold film as an inner layer. As the metal film 14a, at least one metal film selected from a tungsten film, a nickel film and a gold film is used.

On the bottom surface 12 of the cavity 20, electrode patterns 15, 16 are located, thereby configuring an electronic component mounting part. Electrodes of an optical element 30 are electrically and mechanically connected to the electrode patterns 15, 16, so that the optical element 30 is mounted thereon. The electrode patterns 15, 16 are conductive to an external connection pad on the bottom surface of the substrate 10.

A translucent lid 17 that covers the opening 11 of the cavity 20 is joined to the substrate upper-end surface 14 surrounding the cavity 20 (via the metal film 14a and an adhesive 14b), thereby closing the cavity 20, so that an optical module 2 is formed.

Next, thickness distribution and surface roughness distribution of the metal film 13a will be described.

Figure 4:
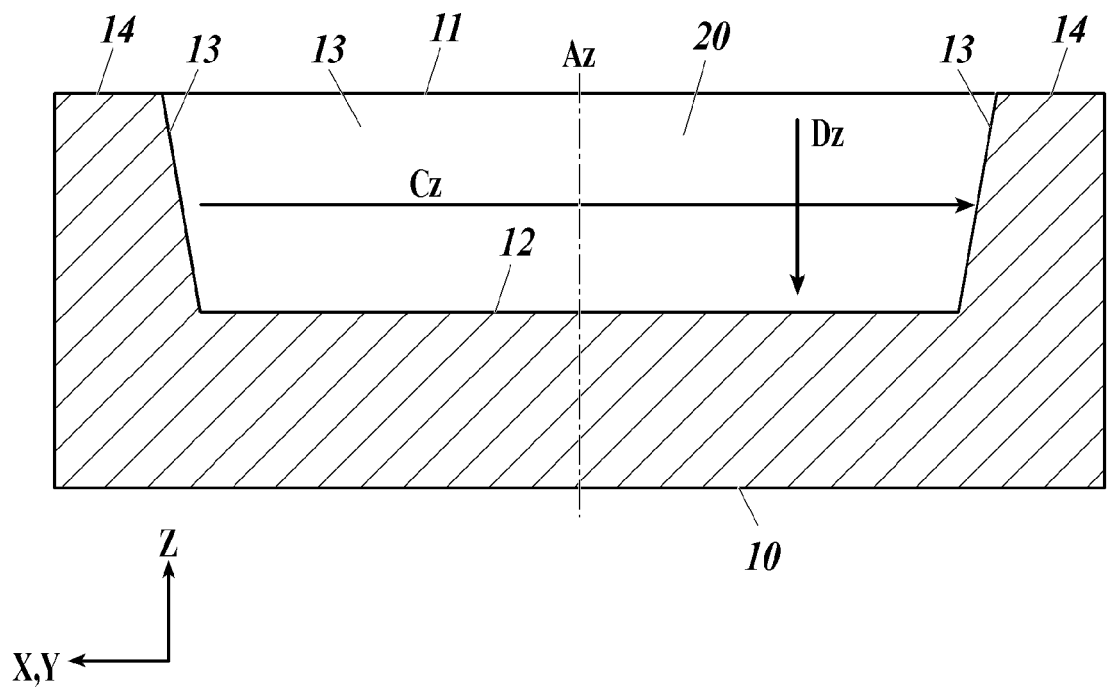
FIG. 4 is a sectional schematic view in which directions on the inner peripheral surface of the electronic component mounting package according to the embodiment of the present disclosure are defined.

Directions on the inner peripheral surface 13 of the cavity are defined as shown in FIG. 4. That is, Cz represents a peripheral direction of the inner peripheral surface 13, and Dz represents a direction from the opening 11 toward the bottom surface 12 along the inner peripheral surface 13.

Figure 5:
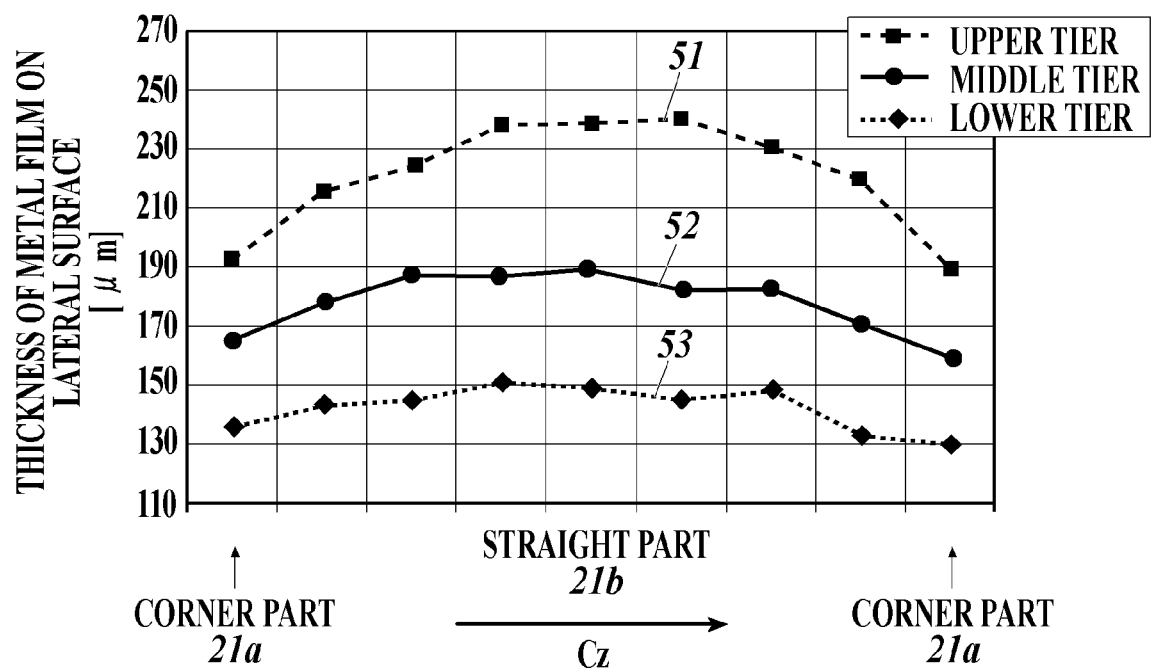
FIG. 5 shows graphs showing thickness distribution of a metal film according to the embodiment of the present disclosure.
Figure 6:
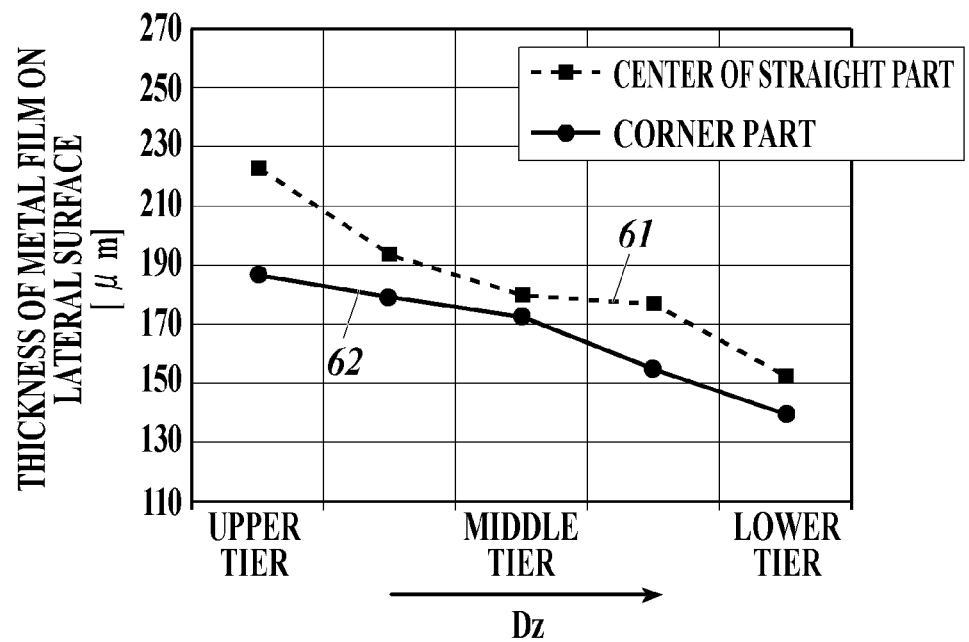
FIG. 6 shows graphs showing thickness distribution of the metal film according to the embodiment of the present disclosure.

FIG. 5 shows graphs of thickness distribution of the metal film 13a in the Cz direction. A graph 51 is for the upper tier that is near the opening 11, a graph 53 is for the lower tier that is near the bottom surface 12, and a graph 52 is for the middle tier between these. The range shown is for one side (from a corner part to the next corner part). FIG. 6 shows graphs of thickness distribution of the metal film 13a in the Dz direction. A graph 61 is a graph of the thickness distribution in the Dz direction at the center of a straight part 21b, and a graph 62 is a graph of the thickness distribution in the Dz direction at a corner part 21a.

As shown in FIG. 5 and FIG. 6, the thickness of the metal film 13a is larger at the straight part 21b than at the corner part(s) 21a on the inner periphery having a single distance from the bottom surface 12. As shown in FIG. 5, the graph 51 for the upper tier shows the thickness distribution in the Cz direction on the inner periphery having a single distance from the bottom surface 12. Similarly, the graph 52 for the middle tier and the graph 53 for the lower tier each show the thickness distribution in the Cz direction on the inner periphery having a single distance from the bottom surface 12. As it is understood from any of these graphs, the metal film 13a is thicker at the straight part than at the corner part. It can be confirmed from FIG. 6 that the metal film 13a is thicker at the straight part than at the corner part.

As shown in FIG. 6, at each of the corner part 21a and the straight part 21b, as a position is closer to the bottom surface 12 than to the opening 11 of the cavity 20, the thickness of the metal film 13a becomes smaller and smaller.

Figure 7:
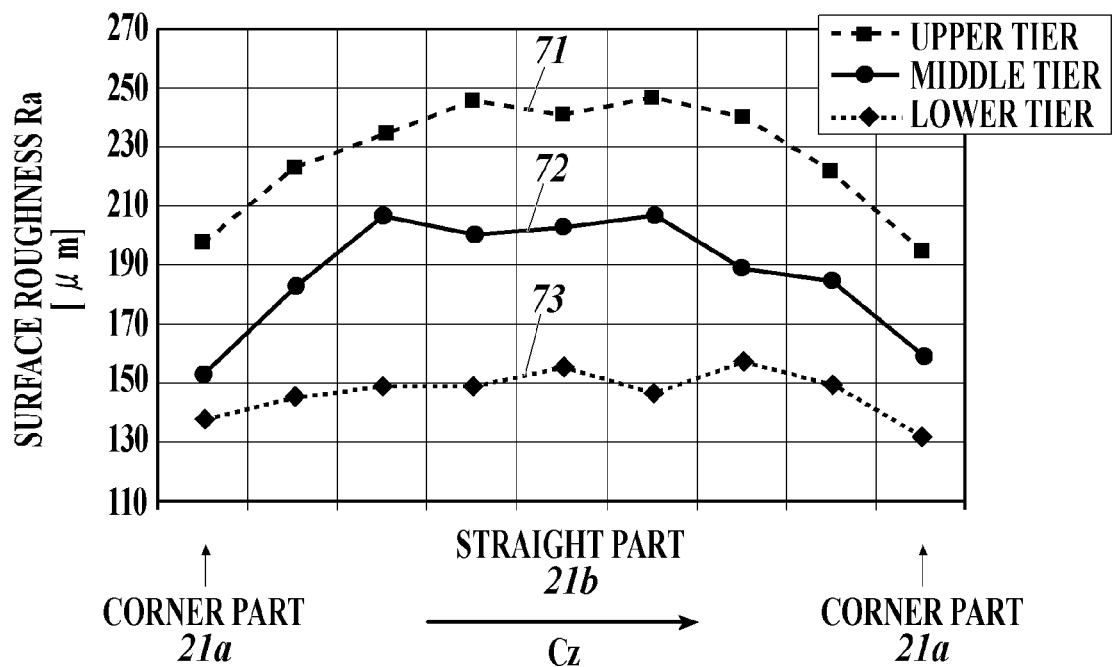
FIG. 7 shows graphs showing surface roughness distribution of the metal film according to the embodiment of the present disclosure.

As shown in FIG. 7, the surface roughness of the metal film 13a is larger at the straight part 21b than at the corner part(s) 21a on the inner periphery having a single distance from the bottom surface 12.

Figure 8:
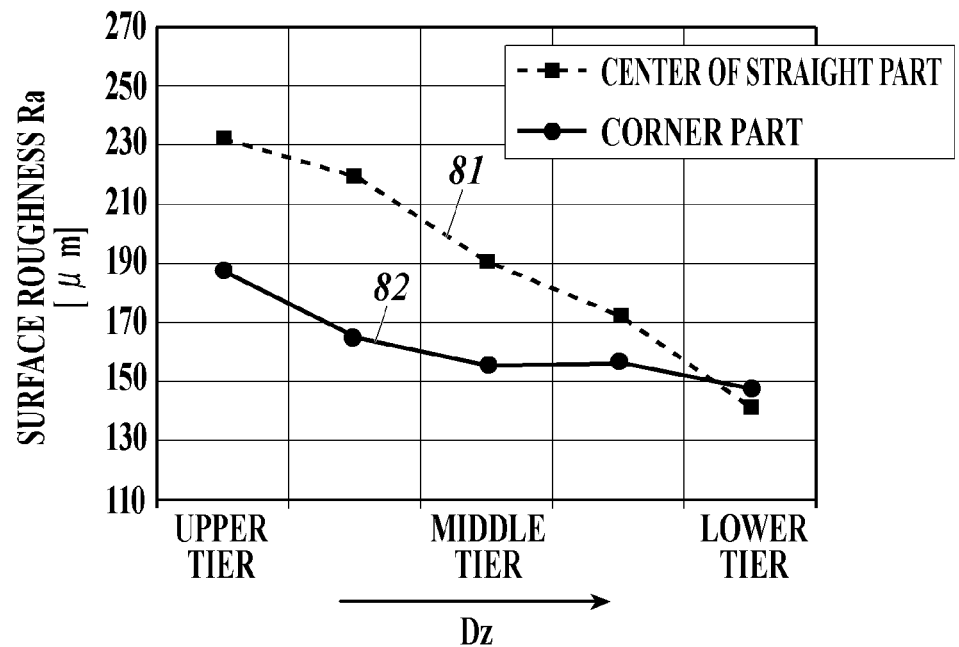
FIG. 8 shows graphs showing surface roughness distribution of the metal film according to the embodiment of the present disclosure.

As shown in FIG. 8, at each of the corner part 21a and the straight part 21b, as a position is closer to the bottom surface 12 than to the opening 11 of the cavity 20, the surface roughness of the metal film 13a becomes smaller and smaller.

Figure 3A:
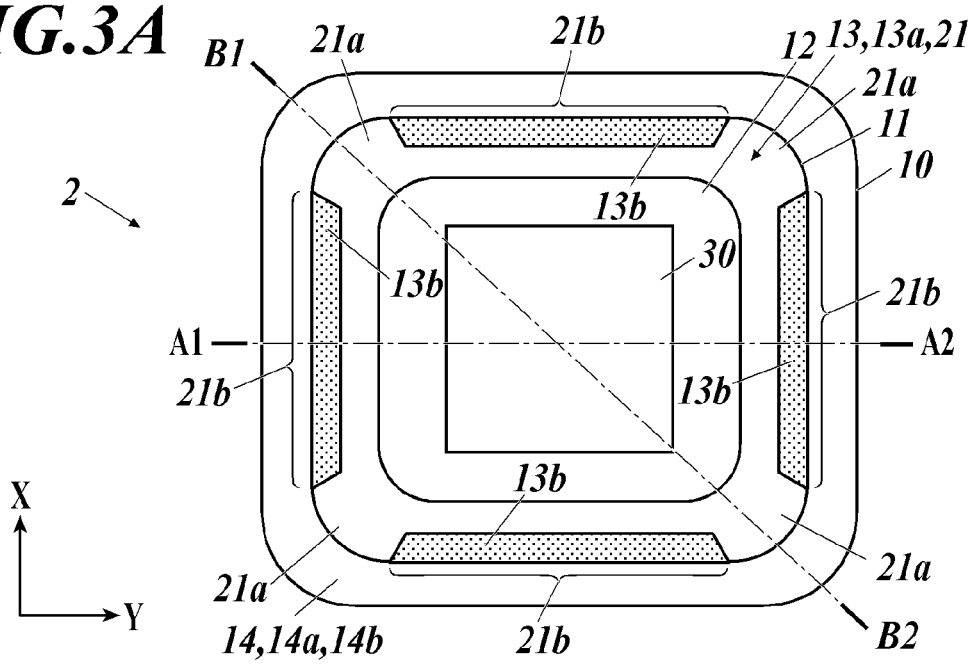
FIG. 3A is a plan view schematically showing an electronic module according to the embodiment of the present disclosure.
Figure 3B:
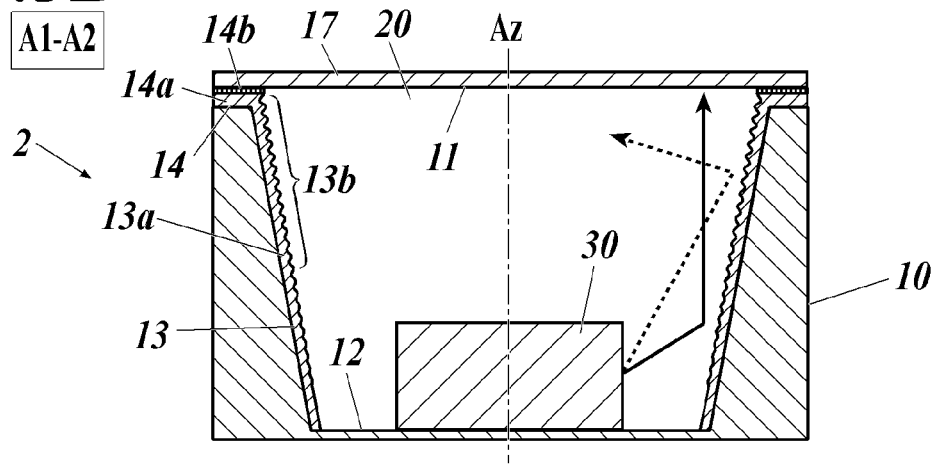
FIG. 3B is an A1-A2 sectional view schematically showing the electronic module according to the embodiment of the present disclosure.

From the above description, thickened regions 13b shown in FIG. 3A and FIG. 3B are each a region schematically showing, of the metal film 13a, a part that is thicker and has a rougher surface than its surroundings.

Next, effects of the above-described configuration will be described.

Figure 9:
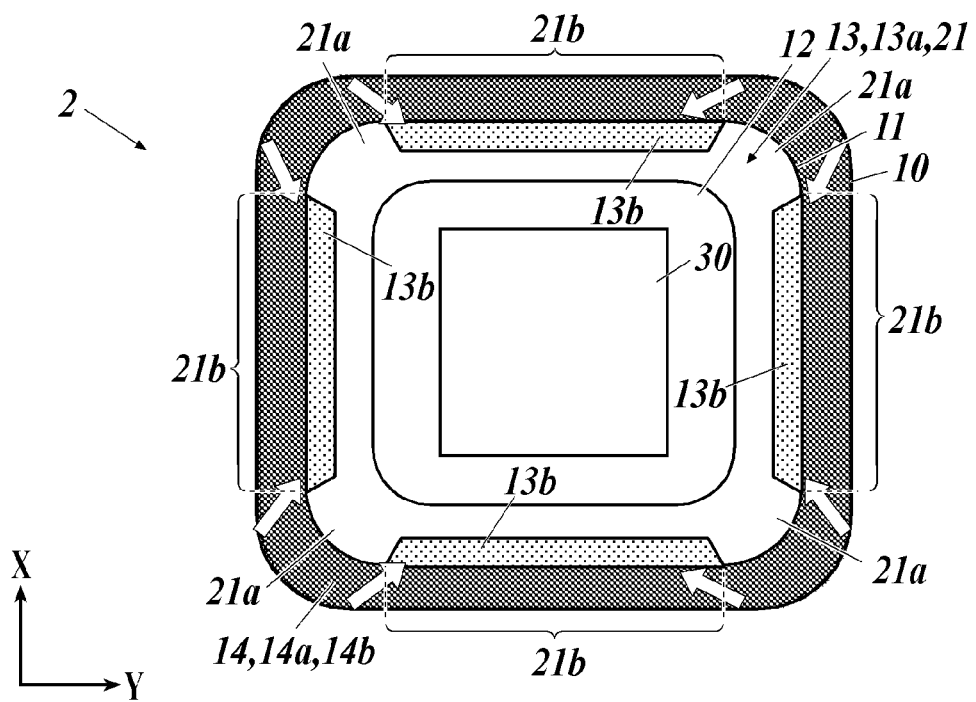
FIG. 9 is a plan view showing heat distribution of an adhesive sealing part in an optical module according to the embodiment of the present disclosure.

FIG. 9 shows heat distribution of an adhesive sealing part in the optical module 2 of this embodiment. FIG. 9 shows high/low levels in the distribution of the heat generated at the time of sealing with an adhesive on the substrate upper-end surface (14) surrounding the cavity (20).

In the optical module 2 of this embodiment, the thickness of the metal film 13a at the corner parts 21a is relatively small, but, as indicated by arrows in FIG. 9, heat paths are located such that the metal film 13 in the thickened regions 13b having a relatively large capacity absorbs and radiates heat, so that non-uniformity of the heat distribution of the sealing part is reduced. The metal film 13a in the thickened regions 13b is excellent in heat dissipation because its surface roughness is large and accordingly its surface area is large. This results in improving reliability of the sealing structure.

Optical properties are as follows.

Figure 3C:
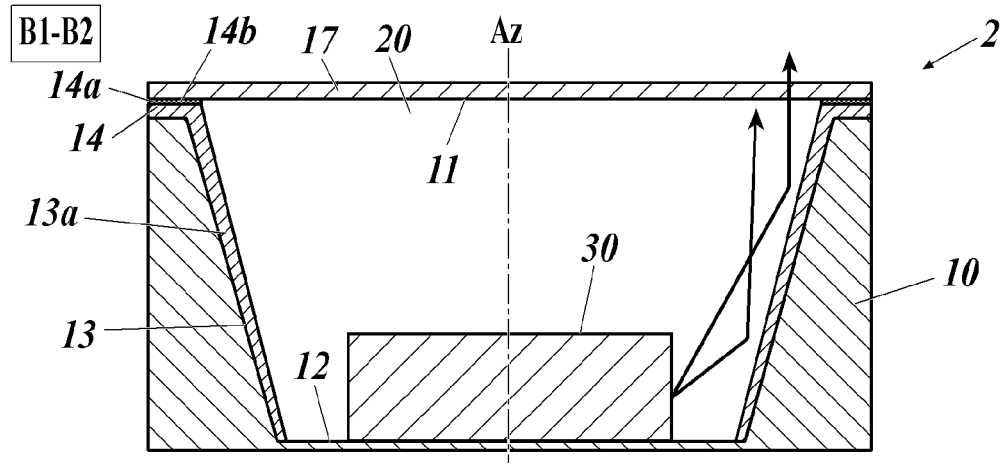
FIG. 3C is a B1-B2 sectional view schematically showing the electronic module according to the embodiment of the present disclosure.

If the optical element 30 is a light-emitting element, such as a light-emitting diode, light emitted from the optical element 30 toward the inner peripheral surface 13 travels as indicated by arrows in FIG. 3B and FIG. 3C.

As shown in FIG. 3B, in a section A1-A2 taken along a line across the straight parts 21b, 21b facing one another, light is produced that is reflected by the metal film 13a in the thickened regions 13b and travels in a direction in which light cannot be released outside through the opening 11 and the lid 17, thereby being confined. This is because the surface roughness of the metal film 13a in the thickened regions 13b is large. Of the light emitted by the optical element 30, the loss due to the light that cannot be released outside is called optical confinement loss. It can be said that the optical confinement loss is large at and around the straight parts 21b owing to the surfaces of the thickened regions 13b, the surface roughness of which is large.

As shown in FIG. 3C, in a section B1-B2 taken along a line across the corner parts 21a, 21a facing one another, the thickness of the metal film 13a is relatively small even near the opening 11, and the surface roughness of the metal film 13a is small, so that the optical confinement loss is small.

Hence, light releasing/emitting efficiency of the optical module 2 can be improved.

If the optical element is a light-receiving element, such as a photodiode, light receiving efficiency of the optical module 2 can be improved.

Further, while the amount of light that is released (exits) from the straight parts 21b, which are close to the center of the optical element 30 as a light source, and their vicinities is reduced, the amount of light that is released (exits) from the corner parts 21a, which are far from the center of the optical element 30 as a light source, and their vicinities is increased. Hence, the amount of light that is emitted on the entire light-emitting surface of the optical module 2 can be uniformized.

If the optical element is a light-receiving element, such as a photodiode, the amount of light that is received on the entire light-receiving surface of the optical module 2 can be uniformized.

Although in the above-described embodiment, the electronic component that is mounted in the electronic component mounting package is an optical element, the electronic component mounting package of the present disclosure is not limited thereto, and any electronic component may be mounted therein. In any case, the effect of improving reliability of the sealing structure is obtained. However, the abovementioned optical characteristics are those in the case where the electronic component is an optical element.

INDUSTRIAL APPLICABILITY

The disclosure is applicable to an electronic component mounting package and an electronic module.

The invention claimed is:
1. An electronic component mounting package comprising:

a substrate with ceramic as a base material, the substrate comprising
  a cavity having a bottom surface where an electronic component mounting part is located and an inner periphery that has a corner part and a straight part; and
  an inner peripheral surface where a first metal film is located,
    the first metal film having a thickness larger at the straight part than at the corner part on the inner periphery having a single distance from the bottom surface.

2. The electronic component mounting package according to claim 1,
  wherein the first metal film has a surface roughness larger at the straight part than at the corner part on the inner periphery having the single distance from the bottom surface.

3. The electronic component mounting package according to claim 1,
  wherein at each of the corner part and the straight part, as a position is closer to the bottom surface than to an opening of the cavity, the thickness of the first metal film becomes smaller and smaller.

4. The electronic component mounting package according to claim 1,
  wherein at each of the corner part and the straight part, as a position is closer to the bottom surface than to an opening end of the cavity, a surface roughness of the first metal film becomes smaller and smaller.

5. The electronic component mounting package according to claim 1,
  wherein a second metal film is located on an end surface surrounding the cavity and adjacent to the inner peripheral surface, and the second metal film on the end surface is continuous with the first metal film on the inner peripheral surface.

6. The electronic component mounting package according to claim 1,
  wherein the inner peripheral surface is inclined outward from the bottom surface toward an opening of the cavity.

7. An electronic module to which the electronic component mounting package according to claim 1 is applied,
  wherein an electronic component is mounted on the electronic component mounting part, and a lid that covers an opening of the cavity is joined to an end surface surrounding the cavity.

8. An electronic module to which the electronic component mounting package according to claim 6 is applied,
  wherein an optical element is mounted on the electronic component mounting part, and a translucent lid that covers the opening of the cavity is joined to an end surface surrounding the cavity.

9. An electronic component mounting package comprising:
  a substrate with ceramic as a base material, the substrate comprising
    a cavity having a bottom surface where an electronic component mounting part is located and an inner periphery that has a corner part and a straight part; and
  an inner peripheral surface where a first metal film is located,
    the first metal film having a surface roughness larger at the straight part than at the corner part on the inner periphery having a single distance from the bottom surface.

10. The electronic component mounting package according to claim 9,
  wherein at each of the corner part and the straight part, as a position is closer to the bottom surface than to an opening of the cavity, the thickness of the first metal film becomes smaller and smaller.

11. The electronic component mounting package according to claim 9,
  wherein at each of the corner part and the straight part, as a position is closer to the bottom surface than to an opening end of the cavity, a surface roughness of the first metal film becomes smaller and smaller.

12. The electronic component mounting package according to claim 9,
  wherein a second metal film is located on an end surface surrounding the cavity and adjacent to the inner peripheral surface, and the second metal film on the end surface is continuous with the first metal film on the inner peripheral surface.

13. The electronic component mounting package according to claim 9,
  wherein the inner peripheral surface is inclined outward from the bottom surface toward an opening of the cavity.

14. An electronic module to which the electronic component mounting package according to claim 9 is applied,
  wherein an electronic component is mounted on the electronic component mounting part, and a lid that covers an opening of the cavity is joined to an end surface surrounding the cavity.

15. An electronic module to which the electronic component mounting package according to claim 13 is applied,
  wherein an optical element is mounted on the electronic component mounting part, and a translucent lid that covers the opening of the cavity is joined to an end surface surrounding the cavity.

* * * * *